(12) United States Patent
Yamaguchi

(10) Patent No.: US 7,923,332 B2
(45) Date of Patent: Apr. 12, 2011

(54) METHOD FOR PRODUCTION OF SEMICONDUCTOR DEVICE

(75) Inventor: Shinpei Yamaguchi, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 12/402,935

(22) Filed: Mar. 12, 2009

(65) Prior Publication Data

US 2009/0233409 A1  Sep. 17, 2009

(30) Foreign Application Priority Data

Mar. 17, 2008 (JP) .................... 2008-067226

(51) Int. Cl.
*H01L 21/336* (2006.01)
*H01L 27/108* (2006.01)
*H01L 29/94* (2006.01)

(52) U.S. Cl. ...................... 438/270; 257/302

(58) Field of Classification Search .......... 438/156, 438/192, 206–210, 12, 268–274, 589, 942, 438/950; 257/135, 263, 302, 328, 510, 513

See application file for complete search history.

(56) References Cited

U.S. PATENT DOCUMENTS

| | | | | |
|---|---|---|---|---|
| 5,504,357 A * | 4/1996 | Kim et al. | 257/306 |
| 6,051,469 A * | 4/2000 | Sheu et al. | 438/270 |
| 6,534,367 B2 * | 3/2003 | Peake et al. | 438/270 |
| 6,716,046 B2 * | 4/2004 | Mistry | 439/270 |
| 2001/0024851 A1 * | 9/2001 | Kubo | 438/220 |
| 2001/0038121 A1 * | 11/2001 | Kim et al. | 257/330 |
| 2002/0013032 A1 * | 1/2002 | Ang et al. | 438/300 |
| 2002/0031890 A1 * | 3/2002 | Watanabe et al. | 438/296 |
| 2009/0197380 A1 * | 8/2009 | Lee | 438/270 |

FOREIGN PATENT DOCUMENTS

JP  2006-013556  1/2006

* cited by examiner

*Primary Examiner* — Michael S Lebentritt
*Assistant Examiner* — Karen M Kusumakar
(74) *Attorney, Agent, or Firm* — SNR Denton US LLP

(57) ABSTRACT

A method for producing a semiconductor device, the method includes the steps of: forming a hard mask layer with a mask opening on a semiconductor substrate in which is formed a source region; forming a side wall mask on the side wall of the mask opening; forming a trench by using the side wall mask and the hard mask layer as a mask in such a way that the trench reaches the source region; removing the side wall mask; forming a gate electrode inside the mask opening and the trench, with a gate insulating film interposed thereunder; forming a side wall on the side wall of the gate electrode; and forming a drain region on the surface of the semiconductor substrate which is adjacent to the gate electrode.

10 Claims, 8 Drawing Sheets

METHOD FOR PRODUCTION OF SEMICONDUCTOR DEVICE

BACKGROUND OF THE INVENTION

1. Field of the Invention

The present invention relates to a method for production of a semiconductor device.

2. Description of the Related Art

An existing method of producing a vertical transistor will be explained below with reference to FIGS. 2A to 2E.

As FIG. 2A shows, the first step is to work a semiconductor substrate 111 to form a source region 112 therein. Then the surface of the semiconductor substrate 111 is coated with a hard mask layer 113 which has a mask opening 114.

The semiconductor substrate 111 undergoes etching through the hard mask layer 113 as an etching mask. This etching forms a trench 115 which causes the source region 112 to appear at its bottom or gets into the source region 112.

As FIG. 2B shows, the hard mask layer 113 shown in FIG. 2A is removed and the inside of the trench 115 and the surface of the semiconductor surface 111 are coated with a gate insulating film 116, which is subsequently oxidized to form a silicon oxide film.

As FIG. 2C shows, the semiconductor substrate 111 is coated with a gate forming film 117 of polysilicon (to be made into a gate electrode) in such a way as to fill the inside of the trench 115, with the gate insulating film 116 interposed between them.

As FIG. 2D shows, the gate forming film 117 is made into a gate electrode 118 by ordinary lithography and etching through a resist mask, which is subsequently removed.

The gate electrode 118 is formed on the substrate 111 in such a way that it is wider than the trench 115.

The gate electrode 118 has its upper part covered with a side wall 119 by the ordinary side wall forming technique.

As FIG. 2E shows, the semiconductor substrate 111 has its upper part (adjacent to the gate electrode 118) converted into a drain region 120 for example by ion implantation with an impurity for conduction.

The silicide layer 121 is formed on the drain region 120. the silicide layer 121 is formed on the gate electrode 118. The drain region 120 and the gate electrode 118 are coated with a silicide layer 121 of cobalt or nickel silicide in the usual way. The way of forming the silicide layer 121 is the same as the way of forming an ordinary silicide layer.

In this way there is obtained the vertical transistor 101. (Japanese Patent Laid-open No. 2006-13556, hereinafter referred to as Patent Document 1.)

The vertical transistor 101 obtained as mentioned above is that the upper part of the gate electrode 118 extends over the semiconductor substrate 111. The extended part (numbered 118A) varies in length d as follows.

The extended part 118A formed by existing technologies greatly varies in length d due to mask misalignment in lithography. Such variation leads to fluctuation in transistor characteristics and prevents the scale down of transistors.

One way to control the length d of the extended part 118A is by self-alignment process which is described below. (See Patent Document 1.)

The self-alignment process consists of forming the trench 115, as explained above with reference to FIG. 2A, and performing wet etching or isotropic dry etching on the hard mask layer 113 so as to remove its portion close to the opening of the trench 115, as shown in FIG. 3. The removed portion 113S is where the extended part 118A of the gate electrode 118 is formed later. This process permits the extended part 118A, shown in FIG. 2E, to be self-aligned with the trench 115.

Dry etching, however, is liable to deteriorate transistor characteristics because it contaminates the channel region of the transistor with impurities originating from the etching gas or with foreign matter due to etching damage.

Wet etching is able to form the removed part 113S if the etchant is dilute hydrofluoric acid (DHF) and the trench 115 is formed by using a mask of silicon oxide ($SiO_2$). However, it is limited in selective ratio because the mask is formed on an $SiO_2$-based material such as STI (Shallow Trench Isolation) and LOCOS (Local Oxidation Of Silicon). In general, it is difficult to employ an $SiO_2$-based material as an etching mask to form the trench.

The problem with selective ratio may be solved by using a silicon nitride film. However, the step of removing a portion of the hard mask layer 113 needs hot phosphoric acid which roughens the silicon surface, thereby deteriorating the transistor characteristics.

It follows, therefore, that the self-alignment process can be applied to form the extended part 118A of the gate electrode 118 with the possibility of deteriorating transistor characteristics.

SUMMARY OF THE INVENTION

The present invention is intended to overcome difficulties encountered in the existing technology which is capable of forming the extended part of the gate electrode by self-alignment process only but is liable to deteriorate transistor characteristics.

The present embodiment makes it possible to eliminate variation in transistor characteristics due to misalignment and deterioration of transistor characteristics by employing a new method for forming a trench in which the gate electrode is formed and also for forming a mask opening in a hard mask layer.

The present embodiment is directed to a method for producing a semiconductor device, the method including the sequential steps of forming a hard mask layer with a mask opening on a semiconductor substrate in which is formed a source region, forming a side wall mask on the side wall of the mask opening, forming a trench by using the side wall mask and the hard mask layer as a mask in such a way that the trench reaches the source region, removing the side wall mask, forming a gate electrode inside the mask opening and the trench, with a gate insulating film interposed thereunder, forming a side wall on the side wall of the gate electrode, and forming a drain region on the surface of the semiconductor substrate which is adjacent to the gate electrode.

The foregoing method according to the present embodiment includes the steps of forming a side wall mask around a mask opening formed in a hard mask layer, forming a trench in the semiconductor substrate by using the hard mask layer and side wall mask as a mask, removing the side wall mask, and forming a mask opening again in the hard mask layer. Therefore, the mask opening is formed by self-alignment process for the trench.

According to this method, it is possible to form the extended part by self-alignment process for the trench. Extended part is that part of the gate electrode which extends over the semiconductor substrate, with the gate electrode being formed as if it is buried inside the trench and the mask opening.

Since the hard mask layer is formed from silicon nitride and the side wall mask is formed from silicon oxide, the side wall mask can be selectively removed by dilute hydrofluoric acid (DHF) after the trench has been formed. Thus, the method of the present embodiment permits the side wall mask to be removed by hydrofluoric acid which is not harmful to the channel forming region.

The method for producing a semiconductor device according to the present embodiment permits the extended part to be formed by self-alignment process for the trench. Processing in this manner produces the effect of preventing vertical transistors from varying in characteristics and hence the effect of contributing to improved yields.

The foregoing method also offers another advantage of not requiring wet etching with hot phosphoric acid harmful to the channel unlike the existing technology which is designed to form the extended part by removing a portion of the hard mask.

DETAILED DESCRIPTION OF THE PREFERRED EMBODIMENT

Figure 1A:
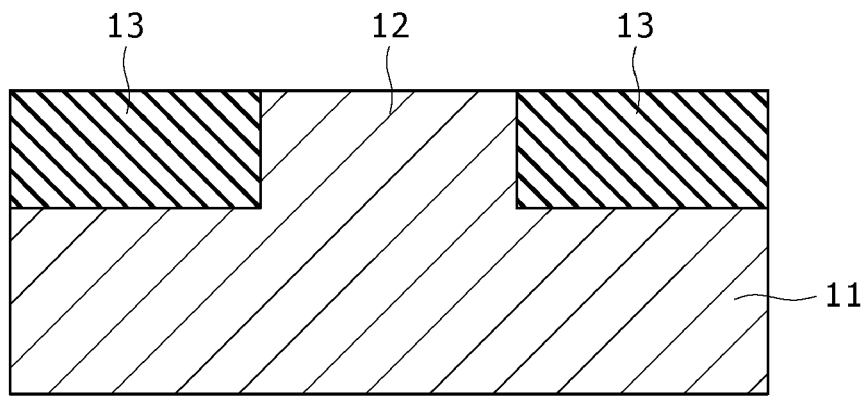
FIGS. 1A to 1C are sectional views showing one step in production of a semiconductor device according to one embodiment (Example) of the present invention.
Figure 1B:
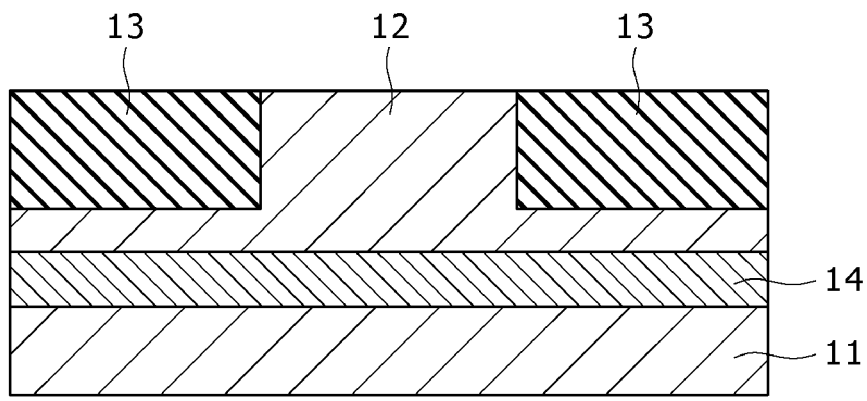
Figure 1C:
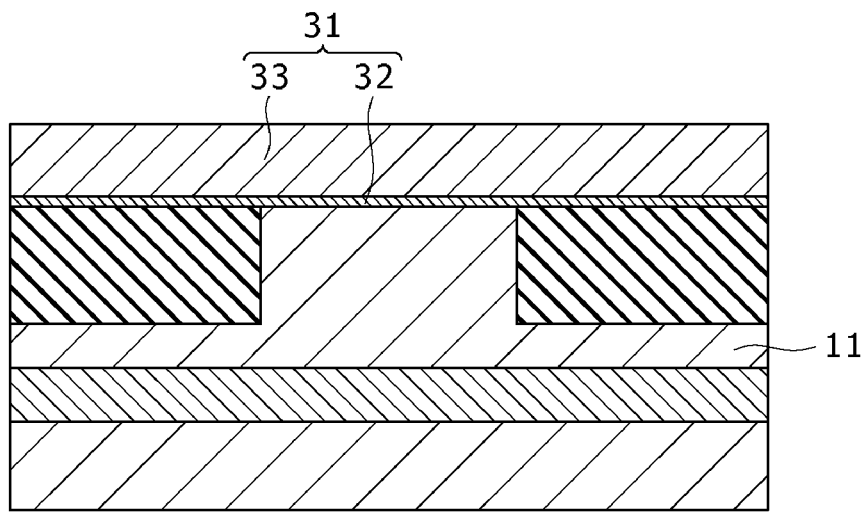
Figure 1D:
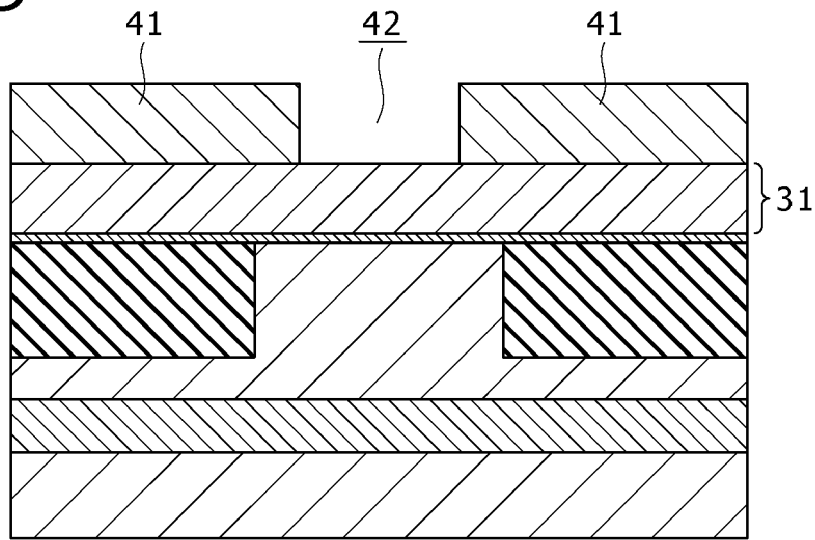
FIGS. 1D to 1F are sectional views showing one step in production of a semiconductor device according to one embodiment (Example) of the present invention.
Figure 1E:
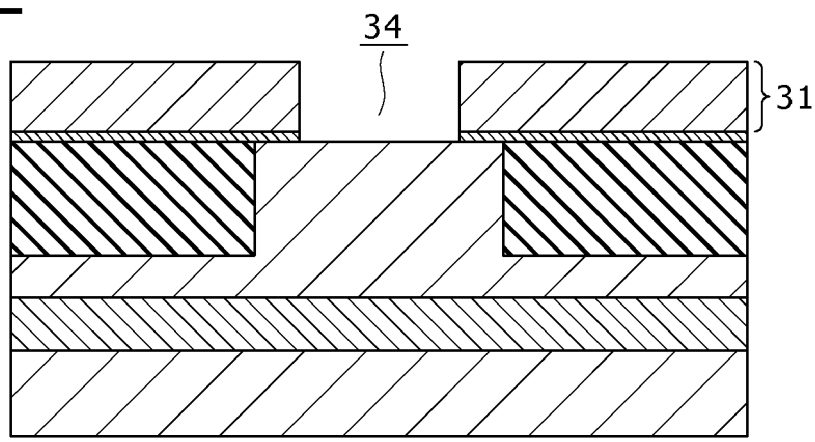
Figure 1F:
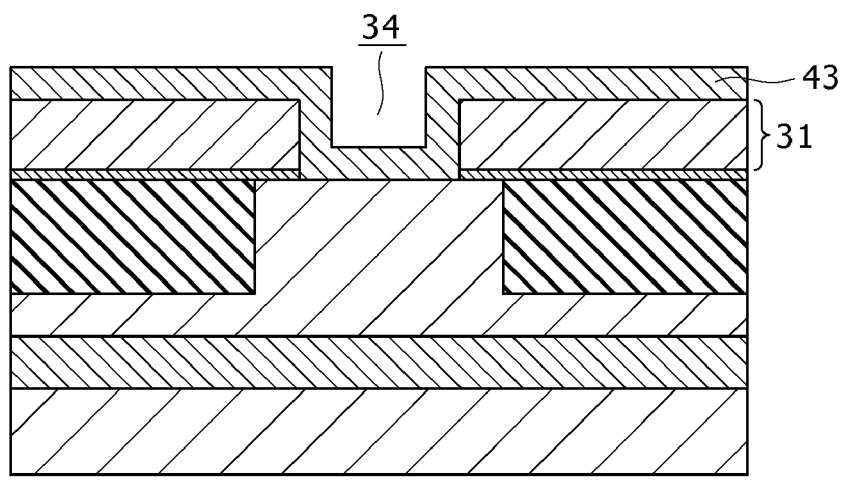
Figure 1G:
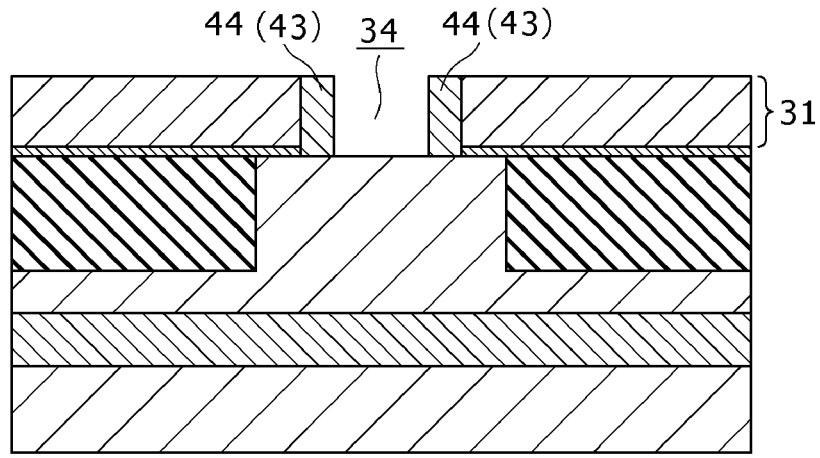
FIGS. 1G to 1I is a sectional view showing one step in production of a semiconductor device according to one embodiment (Example) of the present invention.
Figure 1H:
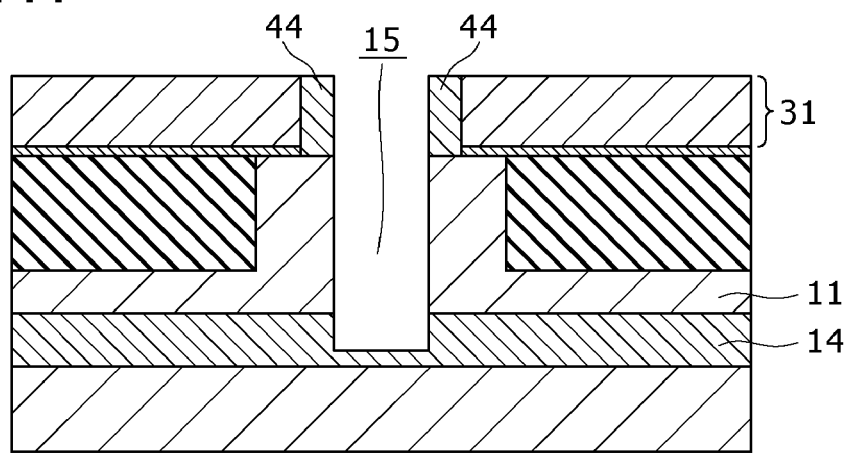
Figure 1I:
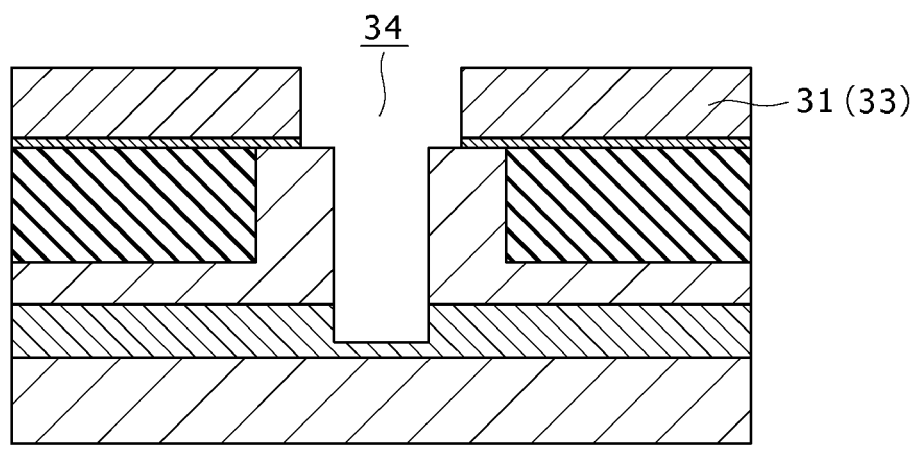
Figure 1J:
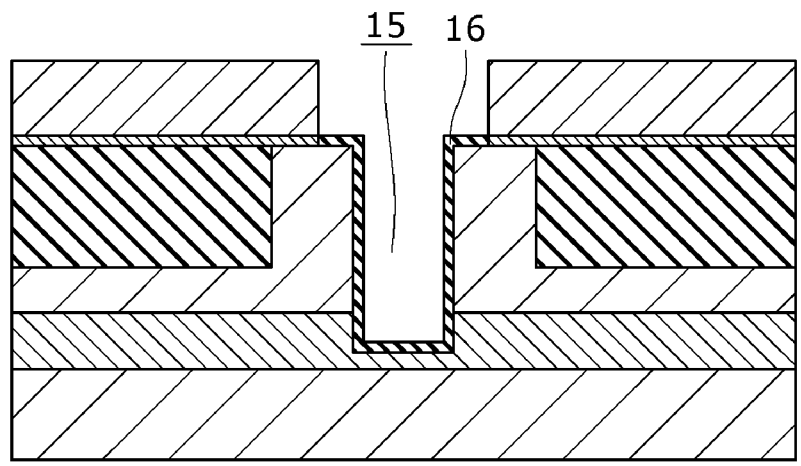
FIGS. 1J and 1K is a sectional view showing one step in production of a semiconductor device according to one embodiment (Example) of the present invention.
Figure 1K:
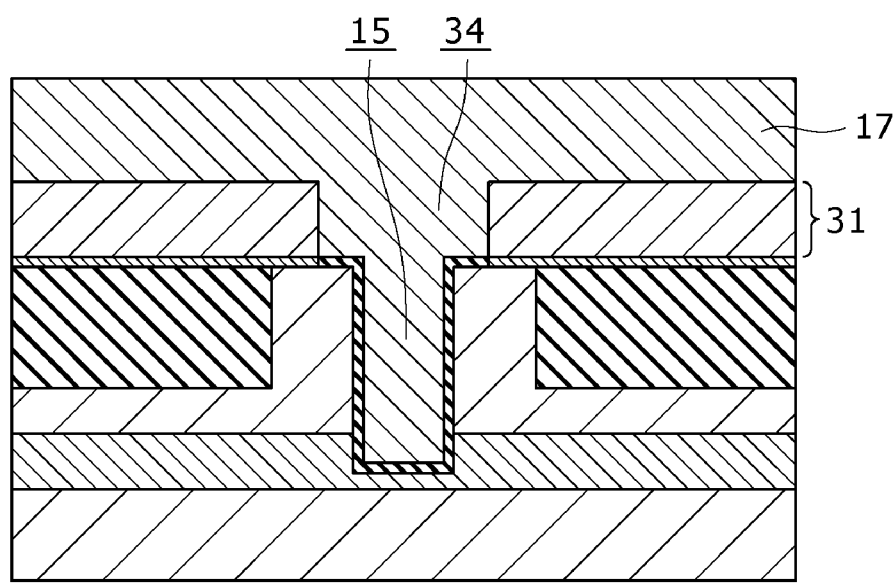
Figure 1L:
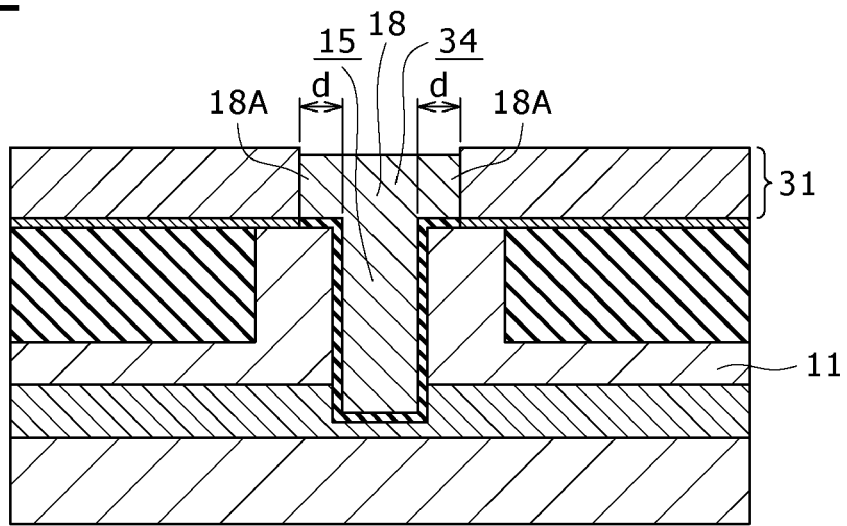
FIGS. 1L to 1N are sectional views showing one step in production of a semiconductor device according to one embodiment (Example) of the present invention.
Figure 1M:
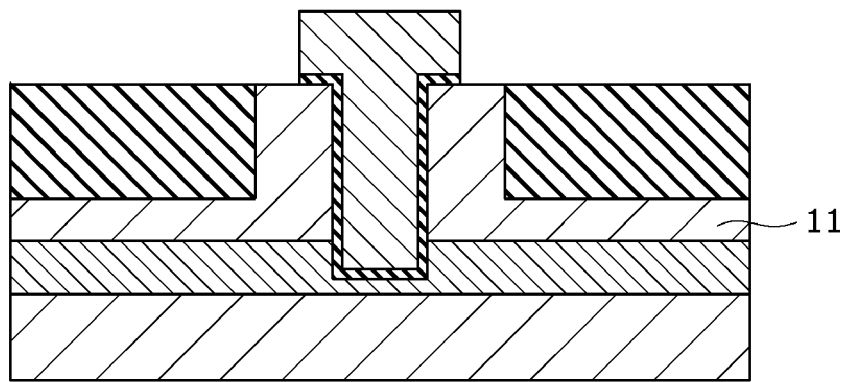
Figure 1N:
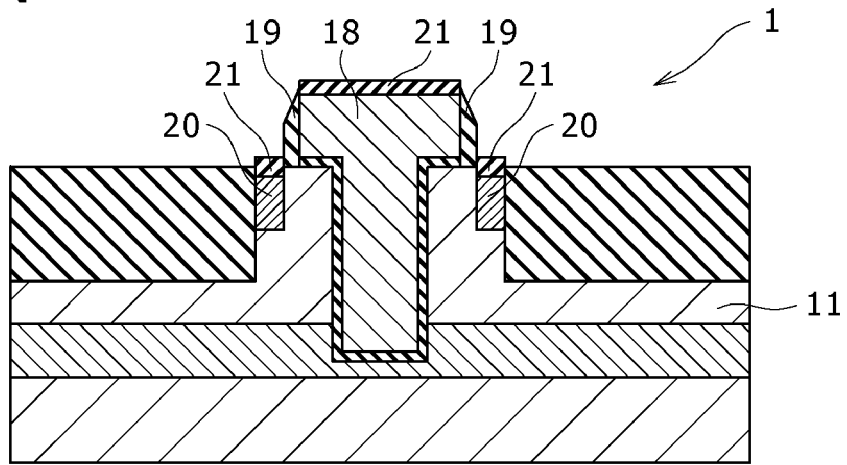
Figure 2A:
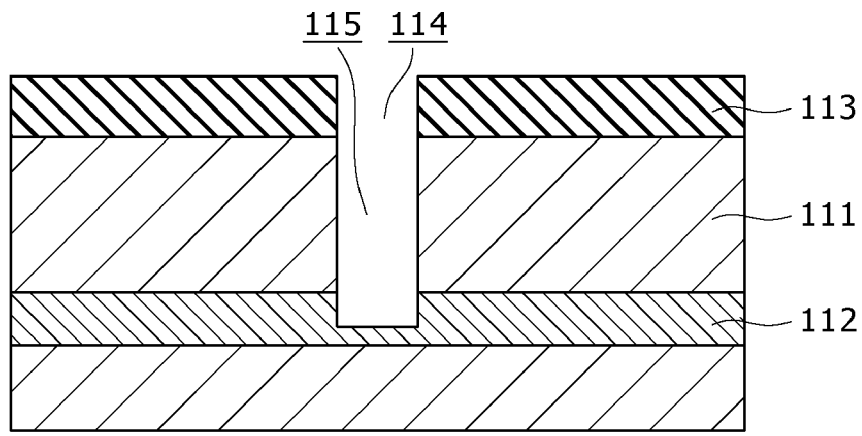
FIGS. 2A to 2C are sectional views showing one step in production of a vertical transistor according to an existing technology.
Figure 2B:
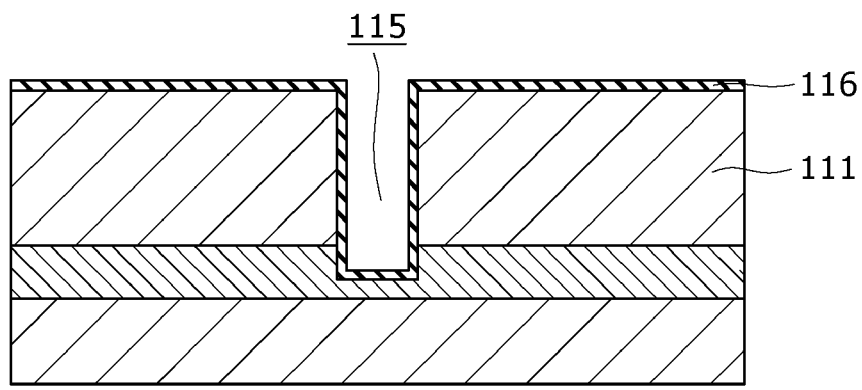
Figure 2C:
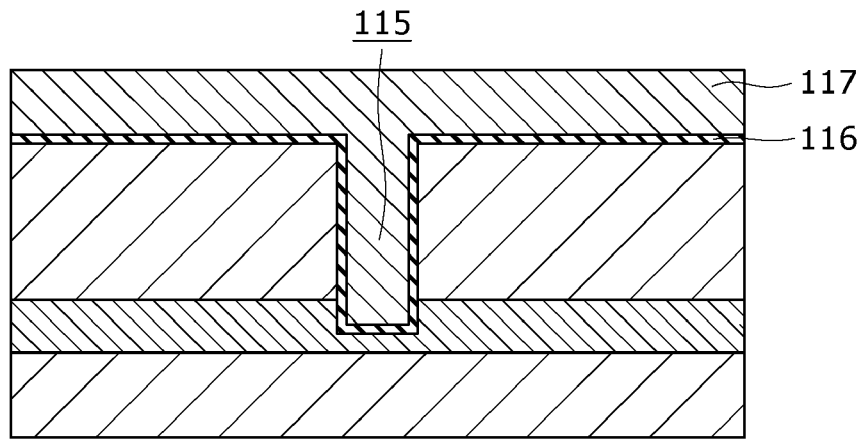
Figure 2D:
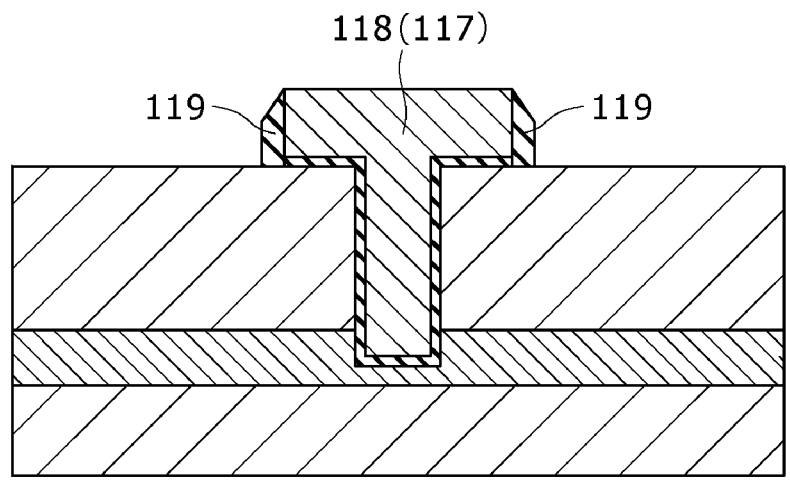
FIGS. 2D and 2E are sectional views showing one step in production of a vertical transistor according to an existing technology.
Figure 2E:
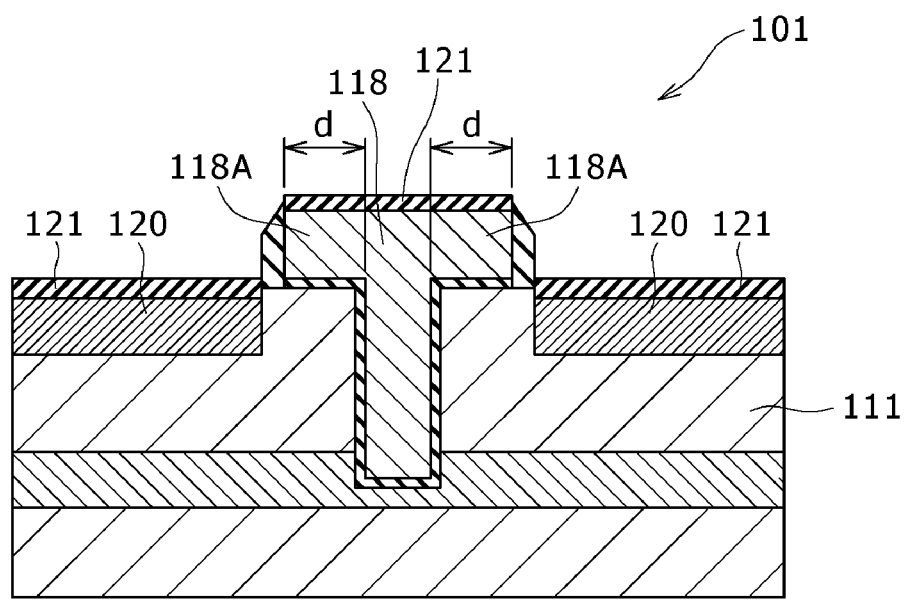
Figure 3:
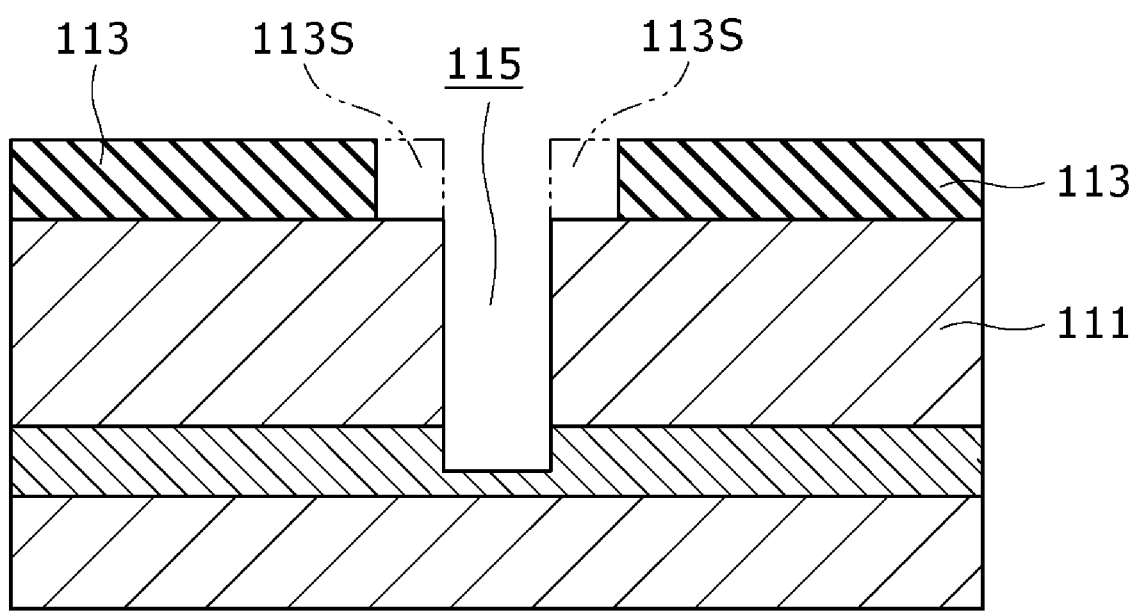
FIG. 3 is a sectional view showing one step in production of a vertical transistor according to an existing technology.

According to one embodiment (Example) of the present invention, the method for production of a semiconductor device works in the following manner as illustrated in FIGS. 1A to 1N which are sectional views showing the steps of production.

The first step shown in FIG. 1A is to fabricate a semiconductor substrate 11 to form a device isolation region 13 therein which isolates a transistor forming region 12.

The semiconductor substrate 11 is a silicon substrate or the like. Alternatively, it may be an SOI substrate having a silicon layer on the surface.

The device isolation region 12 is formed by STI, for instance.

The second step shown in FIG. 1B is to fabricate the semiconductor substrate 11 to form a source region 14 in the transistor forming region 12. The source region 14 may also be formed in the semiconductor substrate 11 under the device isolation region 13.

The source region 14 is formed by ion implantation with a conduction impurity into the semiconductor substrate 11. For example, an n-type conduction impurity for ion implantation into an nMOS transistor is any of phosphorus (P), arsenic (As), and antimony (Sb). Also, a p-type conduction impurity for ion implantation into a pMOS transistor is either boron (B) or boron difluoride ($BF_2$). The source region 14 is formed about 1000 nm under the surface of the semiconductor substrate 11 and it is about 100 to 200 nm wide.

The third step shown in FIG. 1C is to coat the semiconductor substrate 11 with a hard mask layer 31, which is composed of a silicon oxide film 32 and a silicon nitride film 33, for instance.

The silicon oxide film 32 is formed on the surface of the semiconductor substrate 11 by CVD (Chemical Vapor Deposition) process or thermal oxidation process which is commonly used to form a silicon oxide film. The CVD process covers the entire surface of the semiconductor substrate 11, and the thermal oxidation process covers the exposed surface of the semiconductor substrate 11. In the latter case, the silicon oxide film 32 is not usually formed on the device isolation region 13 which is formed from silicon oxide by STI, but it may grow very thin occasionally.

The silicon oxide film 32 may be 10 nm thick, and the silicon nitride film 33 may be 150 nm thick.

The thickness of these films may be changed appropriately.

The fourth step shown in FIG. 1D is to coat the hard mask layer 31 with a resist film, which is subsequently patterned by ordinary lithography to form a resist mask 41 which has a resist opening 42 above the transistor forming region 12.

The fifth step shown in FIG. 1E is to perform etching on the hard mask layer 31 through the resist mask 41 (shown in FIG. 1D as above). This etching forms the mask opening 34 in the hard mask layer 31. Incidentally, this etching should preferably be anisotropic dry etching.

Subsequently, the resist mask 41 is removed. FIG. 1E shows a step in which the resist mask 41 has been removed.

The sixth step shown in FIG. 1F is to coat the surface of the hard mask layer 31 and the side and bottom of the mask opening 34 formed in the hard mask layer 31 with a side wall forming film 43 by reduced pressure CVD method. The side wall forming film 43 may be a silicon oxide film which is 50 nm thick.

The seventh step shown in FIG. 1G is to perform anisotropic dry etching on the side wall forming film 43 in such a way that the side wall forming film 43 remains on the side of the mask opening 34 in the hard mask layer 31. In this way the side wall mask 44 is formed.

The eighth step shown in FIG. 1H is to perform anisotropic dry etching through the side wall mask 44 and hard mask layer 31 as an etching mask so as to form a trench 15 (reaching the source region 14) in the semiconductor substrate 11. In other words, the trench 15 is formed in such a way that it is deep enough for the source region 14 to appear at its bottom or it pierces into the upper part of the source region 14.

The ninth step shown in FIG. 1I is to remove the side wall mask 44 (shown in FIG. 1H above) by wet etching with dilute hydrofluoric acid (DHF), for instance.

This etching leaves intact the hard mask layer 31 whose upper layer is the silicon nitride film 33.

In this way the mask opening 34 is formed again.

The tenth step shown in FIG. 1J is to coat the inside of the trench 15 with a gate insulating film 16 of oxide. The oxide film may be a silicon oxide film 10 nm thick that originates from the surface of the semiconductor substrate 11 by thermal oxidation.

The eleventh step shown in FIG. 1K is to cover the hard mask layer 31 with a gate forming film 17 (to be made into the gate electrode) in such a way that it fills the trench 15 and mask opening 34. The gate forming film 17 is formed from phosphorus-doped amorphous silicon which is commonly used for the transistor gate. It may be 300 nm thick, for example; but it may have any thickness large enough to fill the trench 15 and mask opening 34.

The twelfth step shown in FIG. 1L is to perform dry etching (for etch back) on the gate forming film 17 so that the mask layer 31 exposes itself. This step causes the gate forming film 17 to remain in the opening 34 which is formed in the groove 15 and the hard mask layer 31. The remaining gate forming layer 17 becomes the gate electrode 18, which is slightly lower than the surface of the hard mask layer 31.

Consequently, the thickness of the side wall mask 44 (shown in FIG. 1H) determines the length d of the extended part 18A (lying on the semiconductor substrate 11) of the gate electrode 18.

The thirteenth step shown in FIG. 1M is to remove the hard mask layer 31 (shown in FIG. 1L).

This step consists of substeps of removing the silicon nitride film 33 by wet etching with hot phosphoric acid and removing the silicon oxide film 33 by wet etching with dilute hydrofluoric acid (DHF). The wet etching protects the semiconductor substrate 11 from etching damage.

FIG. 1M is a view, with the hard mask layer 31 removed.

The fourteenth step shown in FIG. 1N is to form a side wall 19 on the upper side of the gate electrode 18. This side wall 19 is formed in the usual way; that is, the gate electrode 18 is covered with a side wall forming film, which is subsequently undergoes etch back, so that it remains on the upper side of the gate electrode 18.

In the subsequent step, that part of the surface of the semiconductor substrate 11, which is adjacent to the gate electrode 18, undergoes ion implantation with a conduction type impurity to form the drain region 20. The impurity may be phosphorus (P), arsenic (As), or antimony (Sb), which is an n-conduction type impurity for nMOS transistors. The impurity may also be boron (B) or boron difluoride ($BF_2$), which a p-conduction type impurity for pMOS transistors.

Then, the drain region 20 is coated with a silicide layer 21. In this step, the gate electrode 18 is also coated with a silicide layer 21 unintentionally.

This silicide is cobalt silicide or nickel silicide.

The silicide layer 21 is formed by the ordinary method which consists of covering the entire surface of the gate electrode 18 with a metal film, performing heat treatment so that the metal film reacts with silicon constituting the gate electrode 18 and the semiconductor substrate 11 to give the silicide layer 21 of metal silicide, and performing wet etching remove excess metal film not involved in silicide reaction. This step may optionally be finished by heat treatment to make the metal silicide compact.

In this way there is completed the semiconductor device 1.

The gate insulating film 16 may be formed as follows from a so-called high-k material which has a higher dielectric constant than silicon oxide.

The inside of the trench 15 is coated with a high-k insulting film of hafnium oxide or aluminum oxide by sputtering or atomic layer deposition (ALD) in the step explained above with reference to FIG. 1J.

Then, the inside of the trench 15 and the inside of the mask opening 34 of the hard mask layer 31 are coated with the gate electrode 18 by the method mentioned above.

Using the gate electrode 18 as a mask, the exposed high-k insulating film is removed by wet etching with hydrofluoric acid if the high-k insulating film is hafnium oxide or aluminum oxide.

The upper side of the gate electrode 18 is covered with the side wall 19, the drain region 20 is formed on that part of the semiconductor substrate 11 which is adjacent to the gate electrode 18, and the silicide layer 21 is formed on the drain region 20, by the step explained above with reference to FIG. 1N.

The above-mentioned method for producing the semiconductor device permits the mask opening 34 to be formed by self-alignment process for the trench 15 because the side wall mask 44 is formed along the mask opening 34 formed in the hard mask layer 31, the trench 15 is formed in the semiconductor substrate 11 by using the hard mask layer 31 and side wall mask 44, the side wall mask 44 is removed, and the mask opening 34 is formed again in the hard mask layer 31.

Therefore, the extended part 18A can be formed by self-alignment process for the trench 15. (The extended part 18A is that part of the gate electrode filling the trench 15 and the mask opening 34 which extends over the semiconductor substrate 11.)

Since the hard mask layer 31 is formed from silicon nitride and the side wall mask 44 is formed from silicon oxide, it is possible to selectively remove the side wall mask 44 (after the trench 15 has been formed) by wet etching with dilute hydrofluoric acid (DHF) which not harmful to the channel forming region.

As mentioned above, the method of the present embodiment permits the extended part 18A to be formed by self-alignment process for the trench 15 and hence it prevents the semiconductor device (vertical transistor) 1 from fluctuating in characteristic properties. Therefore, it contributes to improved yields.

Unlike the existing method which is designed to form the extended part by partly removing the hard mask, the method of the present embodiment does not need wet etching with hot phosphoric acid which is harmful to the channel. This leads to the advantage of not deteriorating the transistor performance.

The present application contains subject matter related to that disclosed in Japanese priority Patent Application JP 2008-067226 filed in the Japan Patent Office on Mar. 17, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for producing a semiconductor device, said method comprising the steps of:
    forming a hard mask layer on a semiconductor substrate, the substrate including a source region;
    forming a resist layer over said hard mask;
    patterning said resist layer to form an opening in the resist layer;
    etching said hard mask to form an opening therein in registry with said opening in said resist layer;
    removing said resist layer;
    forming a side wall mask on a sidewall of said mask opening;
    forming a trench which extends from said opening in said opening in said hard mask to said source region using said side wall mask and said hard mask layer as a mask;
    removing said side wall mask;
    coating a sidewall and floor of said trench with an insulating film;
    forming a gate electrode by filling said trench and said mask opening with a gate electrode material;
    removing said hard mask to expose a portion of said gate electrode extending above a surface of said substrate;

forming a side wall on the side wall of said gate electrode; and forming a drain region below the surface of said semiconductor substrate adjacent to said gate electrode.

2. The method for producing the semiconductor device as defined in claim 1, wherein said hard mask layer comprises a silicon nitride layer and said side wall mask is formed from silicon oxide.

3. The method for producing the semiconductor device as defined in claim 1, wherein said side wall mask comprises silicon oxide and is removed by wet etching with dilute hydrofluoric acid.

4. The method for producing the semiconductor device as defined in claim 1, wherein said drain region is coated with a metal silicide layer.

5. The method of claim 1, wherein in said step of forming said gate electrode, said gate electrode is formed to have a surface that is below a surface of said hard mask.

6. The method of claim 1, wherein in said step of forming said gate electrode, excess gate electrode is removed to expose said hard mask.

7. The method of claim 6, wherein said gate electrode material is removed such that a surface of said gate electrode within said opening of said hard mask is below a surface of said hard mask.

8. The method of claim 1, wherein said hard mask comprises a layer of silicon dioxide and a layer of silicon nitride.

9. The method of claim 1, wherein said substrate includes a previously formed element isolation region in a surface of the substrate.

10. The method of claim 9, wherein was trench is formed in a portion of the substrate other than that including the element isolation region.

* * * * *